(12) United States Patent
Murai et al.

(10) Patent No.: US 12,049,181 B2
(45) Date of Patent: Jul. 30, 2024

(54) VEHICLE

(71) Applicants: TOYOTA JIDOSHA KABUSHIKI KAISHA, Toyota (JP); YAZAKI CORPORATION, Tokyo (JP)

(72) Inventors: Gota Murai, Toyota (JP); Yoku Murayama, Makinohara (JP); Mitsuaki Maeda, Makinohara (JP); Yasutaka Hanaoka, Makinohara (JP)

(73) Assignees: TOYOTA JIDOSHA KABUSHIKI KAISHA, Toyota (JP); YAZAKI CORPORATION, Tokyo (JP)

( * ) Notice: Subject to any disclaimer, the term of this patent is extended or adjusted under 35 U.S.C. 154(b) by 35 days.

(21) Appl. No.: 18/156,485

(22) Filed: Jan. 19, 2023

(65) Prior Publication Data

US 2023/0278511 A1 Sep. 7, 2023

(30) Foreign Application Priority Data

Mar. 3, 2022 (JP) .................................. 2022-032963

(51) Int. Cl.
*B60R 16/033* (2006.01)
*H02J 7/00* (2006.01)
*G01R 19/04* (2006.01)

(52) U.S. Cl.
CPC .......... *B60R 16/033* (2013.01); *H02J 7/0063* (2013.01); *H02J 7/007* (2013.01); *G01R 19/04* (2013.01)

(58) Field of Classification Search
CPC ......... B60R 16/033; H02J 7/00; H02J 7/0063; H02J 7/007; G01R 19/04
See application file for complete search history.

(56) References Cited

U.S. PATENT DOCUMENTS

2018/0034259 A1    2/2018  Sugisawa

FOREIGN PATENT DOCUMENTS

JP           2016-163403 A       9/2016

*Primary Examiner* — Robert L Deberadinis
(74) *Attorney, Agent, or Firm* — Oblon, McClelland, Maier & Neustadt, L.L.P.

(57) ABSTRACT

A vehicle includes an electric power source, a load configured to be supplied electric power from the electric power source, a relay provided between the electric power source and the load, and a processor. The processor is configured to control the relay to a conductive state based on a predetermined drive instruction. The processor is configured to acquire a value of current flowing through the relay and a value of voltage applied to the relay after a predetermined amount of time elapses following conduction of the relay based on the drive instruction. The processor is configured to transmit the value of the current and the value of the voltage that are acquired to an external of the vehicle.

5 Claims, 3 Drawing Sheets

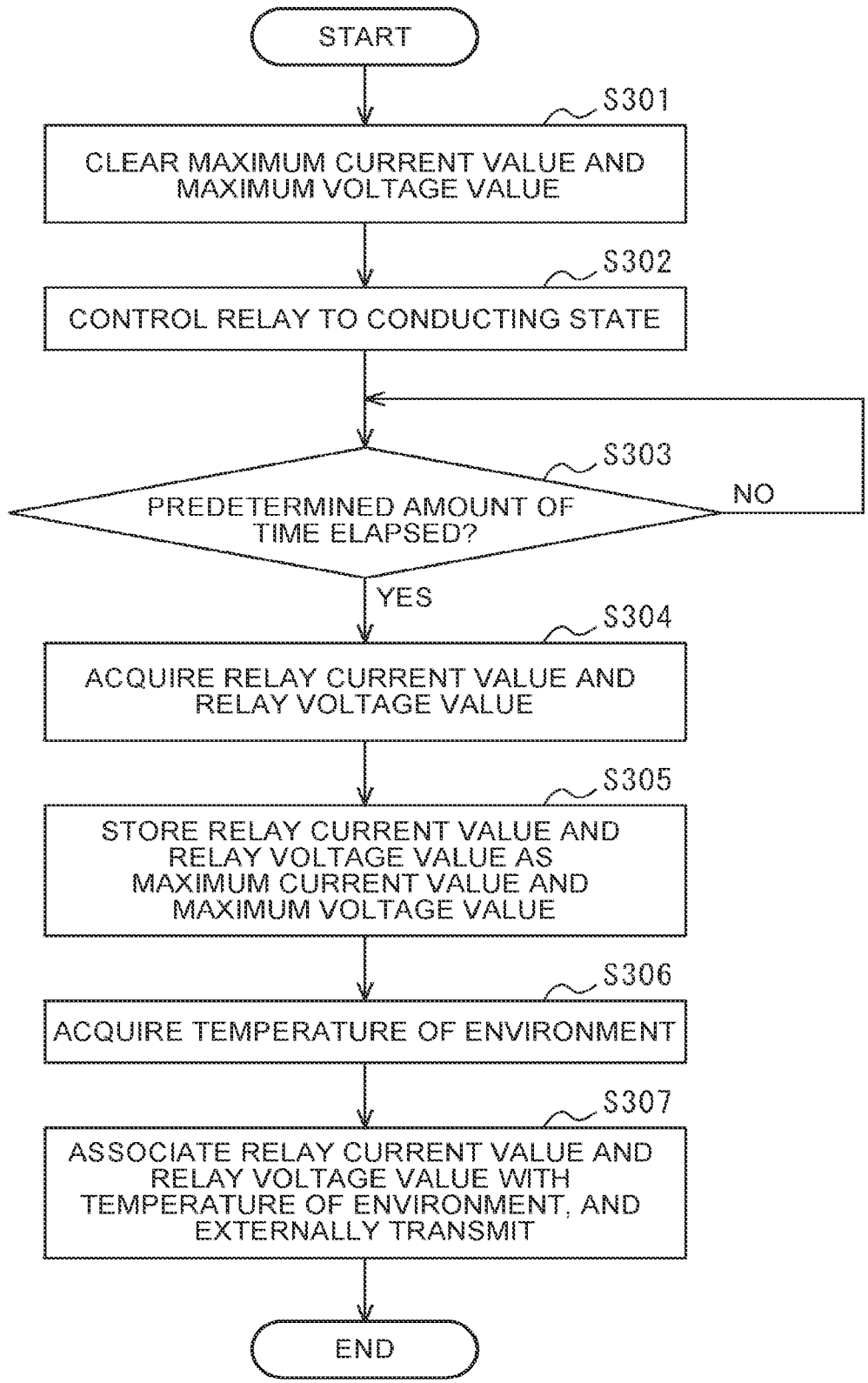

VEHICLE

CROSS-REFERENCE TO RELATED APPLICATION

This application claims priority to Japanese Patent Application No. 2022-032963 filed on Mar. 3, 2022, incorporated herein by reference in its entirety.

BACKGROUND

1. Technical Field

The present disclosure relates to a vehicle and so forth that is equipped with a relay device and so forth used to control electric power supply from an electric power source to a load.

2. Description of Related Art

Japanese Unexamined Patent Application Publication No. 2016-163403 (JP 2016-163403 A) discloses an interrupting device that interrupts supply of current to a load installed in a vehicle, based on temperature of an electric wire supplying current to the load. In this interrupting device, interrupting control is performed using field-effect transistor (FET) switches based on the difference between the temperature of the electric wire that carries current to the load and the temperature of the surroundings of the electric wire.

SUMMARY

When designing the diameter of electric wires used in vehicles, drive circuit elements that control the supply of electric power to loads installed in vehicles, and so forth, design is desirably performed with margin on the safe side (high safety factor), taking into consideration temperature dependency and manufacturing variance with respect to the current consumed by the load. However, in order to efficiently design with a high safety factor, acquiring the value of the current actually consumed by the load, with high precision and stability, is necessary. Accordingly, there is room for improvement regarding the technique of such acquisition.

The present disclosure provides a vehicle that can acquire the value of the current actually consumed by the load installed in the vehicle with high precision and stability.

In a first aspect of the present disclosure, a vehicle includes an electric power source, a load configured to be supplied electric power from the electric power source, a relay provided between the electric power source and the load, and a processor. The processor is configured to control the relay to a conductive state based on a predetermined drive instruction. The processor is configured to acquire a value of current flowing through the relay and a value of voltage applied to the relay after a predetermined amount of time elapses following conduction of the relay based on the drive instruction. The processor is configured to transmit the value of the current and the value of the voltage that are acquired to an external of the vehicle.

In the vehicle according to the first aspect of the present disclosure, the predetermined amount of time may be set to no less than an amount of time required for the current flowing through the relay to reach a maximum value, following the relay conducting.

In the vehicle according to the first aspect of the present disclosure, the processor may be configured to acquire a temperature of an environment in which the vehicle is situated. The processor may be configured to transmit, to the external of the vehicle, the value of the current and the value of the voltage that are acquired, in association with the temperature of the environment.

In the vehicle according to the first aspect of the present disclosure, the load may be in-vehicle equipment with a temperature dependency on a consumption amount of current.

In the vehicle according to the first aspect of the present disclosure, the processor may be configured to store the value of the current and the value of the voltage that are acquired as a maximum current value and a maximum voltage value, respectively.

With the vehicle according to the present disclosure described above, the value of the current actually consumed by the load installed in the vehicle can be acquired with high precision and stability.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein:

FIG. 3 is a flowchart of information acquisition processing executed by configurations of the vehicle.

DETAILED DESCRIPTION OF EMBODIMENTS

A vehicle according to the present disclosure awaits for a predetermined amount of time to elapse after a relay that supplies electric power from an electric power source to a load is controlled to a conducting state, before acquiring a value of current flowing through the relay, and a value of a voltage applied to the relay. This suppresses variance in current and voltage when conducting electricity from the electric power source to the load from affecting actions of acquisition. Accordingly, the value of the current actually consumed by the load can be acquired with high precision and stability.

An embodiment of the present disclosure will be described below in detail with reference to the drawings.

Embodiment

Configuration

Figure 1:
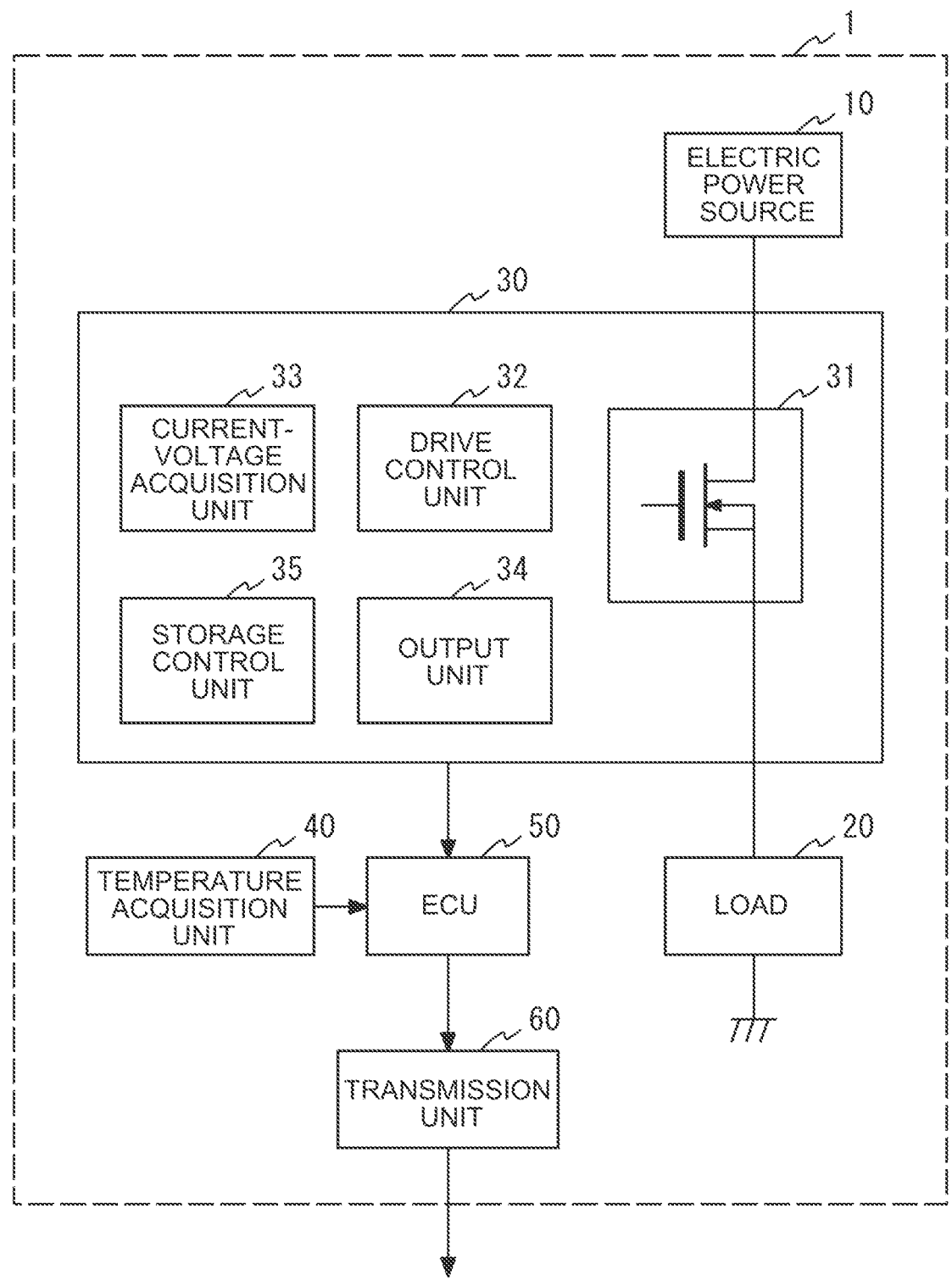
FIG. 1 is a block diagram illustrating a schematic configuration of a vehicle according to an embodiment of the present disclosure.

FIG. 1 is a block diagram illustrating a schematic configuration of a vehicle 1 according to an embodiment of the present disclosure. The vehicle 1 illustrated in FIG. 1 includes an electric power source 10, a load 20, a relay device 30, a temperature acquisition unit 40, an electronic control unit (ECU) 50, and a transmission unit 60. Examples of the vehicle 1 include a hybrid electric vehicle, a plug-in hybrid electric vehicle, a battery electric vehicle, and so forth, which use an electric motor as a motive power source.

The electric power source 10 is a source of electric power supply for supplying electric power to the load 20 installed in the vehicle 1. Examples of the electric power source 10 include an auxiliary battery, which is a secondary battery configured to be capable of being charged and discharged, such as a lead-acid battery or lithium-ion battery. In addition to the auxiliary battery, a drive battery and so forth, which are used for vehicle to travel, are installed in the vehicle 1, but the drive battery and so forth are omitted from illustration.

The load 20 is in-vehicle equipment, such as an electrical component that operates under electric power supplied by the electric power source 10. This load 20 is connected to the electric power source 10 via the relay device 30. Examples of the load 20 include in-vehicle equipment such as rear defoggers, mirror heaters, and so forth that have temperature dependency on consumption amount of current. Rear defoggers, mirror heaters, and so forth require a greater current to be applied to heat the heaters in order to reduce fogging when the outside temperature of the vehicle 1 is low, as compared to when the outside temperature is high. Accordingly, rear defoggers, mirror heaters, and so forth, have temperature dependency on consumption amount of current.

The relay device 30 is a device for interrupting the current supply from the electric power source 10 to the load 20 when an overcurrent flowing to the load 20 is imminent. Examples of the relay device 30 include a power distribution box (PDB) and so forth. The relay device 30 includes a relay 31, a drive control unit 32, a current-voltage acquisition unit 33, an output unit 34, and a storage control unit 35.

The relay 31 is provided between the electric power source 10 and the load 20. The relay 31 is configured to control a state of supply of electric power from the electric power source 10 to the load 20. A semiconductor relay such as, for example, a field effect transistor (metal-oxide-semiconductor field-effect transistor (MOSFET)) or the like, can be used as the relay 31. The relay 31 can switch between a conducting state in which the load 20 is connected to the electric power source 10 and an interrupted state of the load 20 being disconnected from the electric power source 10, based on the control of the drive control unit 32 described below.

The drive control unit 32 controls a drive state of the relay 31. The drive control unit 32 is a configuration for controlling the state of electric power supply from the electric power source 10 to the load 20. The drive control unit 32 can control the relay 31 to a conducting state (relay ON), based on a predetermined drive instruction commanding the load 20 to operate. The predetermined drive instruction is, for example, to apply an ON voltage to the gate of a field-effect transistor.

Figure 2:
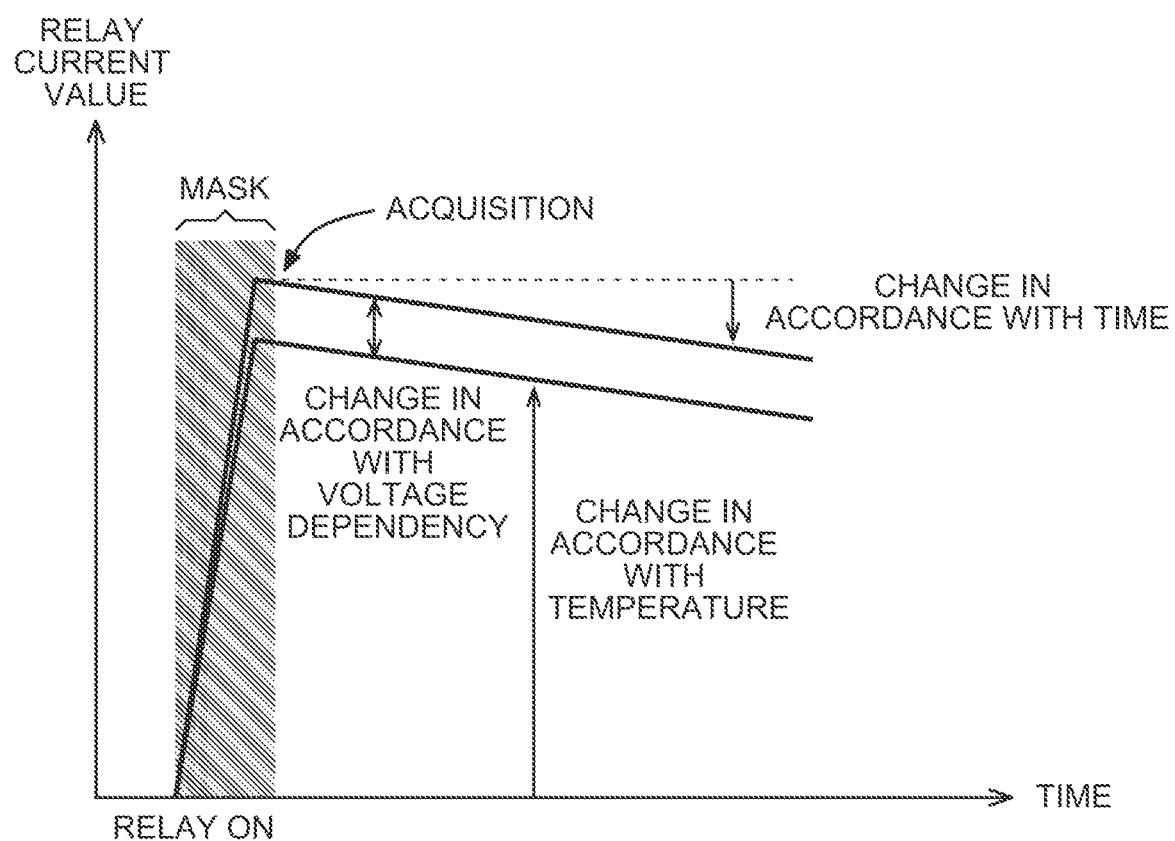
FIG. 2 is a diagram showing an example of change in current flowing through a relay after the relay conducts.

The current-voltage acquisition unit 33 is a configuration for acquiring the value of the current flowing through the relay 31 (hereinafter referred to as "relay current value") and the value of the voltage applied to the relay 31 (hereinafter referred to as "relay voltage value"). Detecting elements such as a current sensor and a voltage sensor (omitted from illustration) provided in the relay 31 can be used to acquire the relay current value and the relay voltage value. The current-voltage acquisition unit 33 acquires the relay current value and the relay voltage value after a predetermined amount of time has elapsed following the relay 31 being placed in a conducting state (relay ON) by the drive control unit 32 in response to a drive instruction. The predetermined amount of time is a period during which the relay current value is not stable, as exemplified in FIG. 2, and is a mask time during which the processing is made to stand by so that no acquisition actions are performed (shaded portion in FIG. 2). Accordingly, the predetermined amount of time is set to no less than the amount of time required for the relay current value to reach the maximum thereof (e.g., one second) after the relay 31 enters the conducting state (relay ON).

The output unit 34 is a configuration for outputting the relay current value and the relay voltage value acquired by the current-voltage acquisition unit 33 to the ECU 50. An in-vehicle network such as a controller area network (CAN) can be used for this output.

The storage control unit 35 is a configuration for storing the relay current value and the relay voltage value acquired by the current-voltage acquisition unit 33. The storage control unit 35 stores the relay current value and the relay voltage value as the maximum current value and the maximum voltage value, respectively.

The temperature acquisition unit 40 acquires the temperature of the environment in which the vehicle 1 is situated. Specifically, the temperature acquisition unit 40 can acquire the temperature outside of the vehicle 1 from a detecting element such as a temperature sensor (omitted from illustration) that is installed in the vehicle 1.

The ECU 50 is one of a plurality of electronic control units that is installed in the vehicle 1 to control vehicle operations. Electronic control units are typically configured including a processor, memory, an input/output interface, and so forth. Electronic control units realize various types of functions by the processor reading out and executing programs stored in the memory. A body ECU that controls the functions of a body system can be used as the ECU 50 in the present embodiment. The ECU 50 acquires the relay current value and the relay voltage value from the relay device 30, and also acquires the temperature of the environment at that time from the temperature acquisition unit 40. The ECU 50 then performs the processing of associating the relay current value and the relay voltage value with the temperature of the environment.

The transmission unit 60 transmits the relay current value and the relay voltage value and the temperature of the environment, associated by the ECU 50, to the external of the vehicle 1. Examples of transmission destinations include centers, servers, and so forth, that collect/manage various types of data related to the vehicle 1. The transmission unit 60 may be, for example, a data communication module (DCM) that is configured to be able to communicate with a center, a server, or the like.

Note that part or all of the relay device 30, the temperature acquisition unit 40, and the transmission unit 60, described above, can be configured as an ECU.

Control

Next, control carried out by the vehicle 1 according to the present embodiment will be described with reference to FIG. 3. FIG. 3 is a flowchart showing procedures of the information acquisition processing executed by the configurations of the vehicle 1. The information acquisition processing is initiated when an instruction to drive the load 20 is issued to the drive control unit 32.

Step S301

The storage control unit 35 clears the maximum current value, which is the maximum value of the relay current value, and the maximum voltage value, which is the maximum value of the relay voltage value. This resets the respective maximum values stored in the previous processing. Once the maximum current value and the maximum voltage value are cleared, the processing advances to step S302.

Step S302

The drive control unit 32 controls the relay 31 to the conducting state (relay ON), based on an instruction to drive the load 20. Thus, electric power is supplied from the electric power source 10 to the load 20, and the predetermined operation by the load 20 is initiated. Upon the relay 31 being controlled to the conducting state, the processing advances to step S303.

Step S303

The current-voltage acquisition unit 33 determines whether a predetermined amount of time has elapsed since the relay 31 was controlled to the conducting state by the drive control unit 32. When the predetermined amount of time has elapsed (YES in step S303), the processing advances to step S304. When the predetermined amount of time has not elapsed (NO in step S303), the processing does not proceed to the next processing until the predetermined amount of time elapses.

Step S304

The current-voltage acquisition unit 33 acquires the relay current value and the relay voltage value from the relay 31. Due to the current-voltage acquisition unit 33 standing by for the predetermined amount of time in step S303, the current-voltage acquisition unit 33 can acquire a relay current value and a relay voltage value that are stable. Once the relay current value and the relay voltage value are acquired, the processing advances to step S305.

Step S305

The storage control unit 35 stores the relay current value and the relay voltage value acquired by the current-voltage acquisition unit 33 as the maximum current value and the maximum voltage value. Upon the maximum current value and the maximum voltage value being stored, the processing advances to step S306.

Step S306

The temperature acquisition unit 40 acquires the temperature of the environment in which the vehicle 1 is situated. Once the temperature of the environment is acquired, the processing advances to step S307.

Step S307

The ECU 50 and the transmission unit 60 associate the relay current value and the relay voltage value with the temperature of the environment, and transmit the relay current value, the relay voltage value, and the temperature of the environment to the external of the vehicle 1. When the relay current value, relay voltage value, and the temperature of the environment, which are associated, are transmitted to the external of the vehicle 1, this information acquisition processing ends.

Operations and Effects

As described above, according to the vehicle 1 of an embodiment of the present disclosure, the relay current value and the relay voltage value are acquired after awaiting for a predetermined amount of time to elapse following the relay 31 being controlled to a conducting state by the drive control unit 32.

This suppresses variance in current and voltage when conducting electricity from the electric power source 10 to the load 20 from affecting actions of acquisition. Accordingly, the value of the current actually consumed by the load 20 can be acquired with high precision and stability.

Also, with the vehicle 1 of the present embodiment, each time the relay 31 is controlled to the conducting state by the drive control unit 32, the maximum values of the relay current value and the relay voltage value stored from the processing performed the previous time are cleared, and the newly acquired maximum values of the relay current value and the relay voltage value are associated with the temperature of the environment in which vehicle 1 is situated, and transmitted the maximum values of the relay current value and the relay voltage value and the temperature of the environment to the external of the vehicle 1.

This enables information regarding the maximum current value and the maximum voltage value to be externally provided on a constant basis, in accordance with the temperature of the environment. Accordingly, the center, server, or the like, receiving provision of this information, can suitably design electric wire diameters, drive circuit elements of harnesses, and so forth, used in the vehicle 1, with a margin on the safety side.

Although an embodiment of the technology according to the present disclosure has been described above, the present disclosure can be understood as being, in addition to a vehicle, a method executed by the vehicle provided with a processor and memory, a program of the method, a computer-readable non-transitory recording medium storing the program, and so forth.

The present disclosure can be used for a vehicle that is equipped with a relay device and so forth, used to control electric power supply from an electric power source to a load.

What is claimed is:

1. A vehicle comprising:
   an electric power source;
   a load configured to be supplied electric power from the electric power source;
   a relay provided between the electric power source and the load; and
   a processor configured to
      control the relay to a conductive state based on a predetermined drive instruction,
      acquire a value of current flowing through the relay and a value of voltage applied to the relay, after a predetermined amount of time elapses following conduction of the relay based on the drive instruction, and
      transmit the value of the current and the value of the voltage that are acquired to an external of the vehicle.

2. The vehicle according to claim 1, wherein the predetermined amount of time is set to no less than an amount of time required for the current flowing through the relay to reach a maximum value, following the relay conducting.

3. The vehicle according to claim 1, wherein the processor is configured to:
   acquire a temperature of an environment in which the vehicle is situated; and
   transmit, to the external of the vehicle, the value of the current and the value of the voltage that are acquired, in association with the temperature of the environment.

4. The vehicle according to claim 3, wherein the load is in-vehicle equipment with a temperature dependency on a consumption amount of current.

5. The vehicle according to claim 1, wherein the processor is configured to store the value of the current and the value of the voltage that are acquired as a maximum current value and a maximum voltage value, respectively.

* * * * *